(12) United States Patent
Ra

(10) Patent No.: US 6,278,634 B1
(45) Date of Patent: Aug. 21, 2001

(54) REFERENCE MEMORY CELL INITIALIZATION CIRCUIT AND METHOD

(75) Inventor: Kyeong Man Ra, Chungcheongbuk-do (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/598,211

(22) Filed: Jun. 21, 2000

(30) Foreign Application Priority Data

Jun. 29, 1999 (KR) .................................................. 99/25468

(51) Int. Cl.$^7$ .................................................. G11C 16/06
(52) U.S. Cl. .................................. 365/185.2; 365/185.18; 365/185.28
(58) Field of Search ........................... 365/185.2, 185.18, 365/185.28, 185.21, 210, 185.24

(56) References Cited

U.S. PATENT DOCUMENTS

| 5,566,111 | | 10/1996 | Choi | 365/186.22 |
|---|---|---|---|---|
| 5,608,669 | | 3/1997 | Mi et al. | 365/185.19 |
| 5,659,503 | * | 8/1997 | Sudo et al. | 365/185.2 |
| 5,757,697 | * | 5/1998 | Briner | 365/185.21 |
| 5,784,314 | | 7/1998 | Sali et al. | 365/185.2 |
| 5,859,796 | * | 1/1999 | Cleveland | 365/185.2 |
| 5,917,753 | * | 6/1999 | Dallabora et al. | 365/185.21 |
| 5,936,888 | * | 8/1999 | Sugawara | 365/185.2 |
| 5,973,959 | * | 10/1999 | Gerna et al. | 365/185.03 |

* cited by examiner

Primary Examiner—Son Mai
(74) Attorney, Agent, or Firm—Fleshner & Kim, LLP

(57) ABSTRACT

A circuit and method for initializing a reference memory cell. The circuit comprises a first voltage source for supplying a first voltage to a drain of the reference memory cell in a programming mode of the reference memory cell, a second voltage source for supplying a second voltage to a control gate of the reference memory cell in the programming mode or a read mode of the reference memory cell, a third voltage source for supplying a third voltage to a source of the reference memory cell, a fourth voltage source for supplying a fourth voltage to the source of the reference memory cell in an erase mode of the reference memory cell, the fourth voltage being an erase voltage, a first switch selectively connected to the drain of the reference memory cell in response to a measure signal, for controlling a path for measuring the amount of external current flowing to the reference memory cell, a second switch connected to the source of the reference memory cell for connecting it to the third voltage source or the fourth voltage source in response to an erase control signal, and a current detector connected between the first voltage source and the drain of the reference memory cell, for starting the programming mode of the reference memory cell in response to a programming control signal.

22 Claims, 6 Drawing Sheets

REFERENCE MEMORY CELL INITIALIZATION CIRCUIT AND METHOD

BACKGROUND OF THE INVENTION

1. Field of the Invention

The present invention relates in general to semiconductor memory devices, and more particularly to a circuit and method for initializing a reference memory cell, in which the reference memory cell is very accurately initialized within a minimized period of time.

2. Description of the Prior Art

FIG. 1 is a circuit diagram of a reference memory cell initialization circuit based on a conventional first method. In this drawing, the reference numeral 10 denotes a main memory cell and the reference numeral 17 denotes a reference memory cell. Each of the main and reference memory cells 10 and 17 comprises a source, drain, control gate and floating gate.

A first load 11 is connected between the drain of the main memory cell 10 and a supply voltage source VCC, and a second load 12 is connected between the drain of the reference memory cell 17 and the supply voltage source VCC.

A comparator 13 inputs a first signal on the drain of the reference memory cell 17 at its first signal input terminal, or non-inverting input terminal, and a second signal on the drain of the main memory cell 10 at its second signal input terminal, or inverting input terminal, and then compares the inputted first and second signals with each other. The second signal is provided for reference and the first signal is provided for testing.

A programming controller 16 is provided to block an external path in a programming mode of the reference memory cell 17. A first switch S1 15 is connected to the drain of the reference memory cell 17 to control its connections to the programming controller 16 and the second load 12 in the programming mode of the reference memory cell 17 and a read mode thereof.

A second switch S2 18 is operated to apply a signal from a VPGM source to the gate of the reference memory cell 17 in the programming mode and a signal from a VREF source to the gate of the reference memory cell 17 in the read mode.

The operation of the first method-based reference memory cell initialization circuit with the above-mentioned construction will hereinafter be described.

The first method is to initialize the reference memory cell 17 by performing programming/programming verification operations. Reference current for the programming verification operation is generated from the main memory cell 10.

In order to program the reference memory cell 17, the first switch 15 connected to the drain of the reference memory cell 17 is directed to the programming controller 16, and the second switch 18 connected to the gate of the reference memory cell 17 is directed to the VPGM source. Under this condition, a programming pulse is applied to the reference memory cell 17 to program it.

If the programming of the reference memory cell 17 is completed, then the first switch 15 connected to the drain of the reference memory cell 17 is directed to the first signal input terminal of the comparator 13, and the second switch 18 connected to the gate of the reference memory cell 17 is directed to the VREF source. At this time, a signal VPCX is applied to the gate of the main memory cell 10.

As a result, currents flow respectively to the reference memory cell 17 and main memory cell 10. Here, the current flowing to the main memory cell 10 is defined as reference current and the current flowing to the reference memory cell 17 is defined as test current.

Voltages are generated across the first and second loads 11 and 12, respectively, because of the flow of the reference current and test current and then applied to the comparator 13. As a result, a difference between the currents flowing to the reference memory cell 17 and main memory cell 10 can be known from an output signal from the comparator 13.

If a threshold voltage of the main memory cell 10 is a known value, a threshold voltage of the reference memory cell 17 can be known on the basis of the above current difference. In the case where the current to the reference memory cell 17 is larger in value than that to the main memory cell 10, the first and second switches 15 and 18 are changed to the programming mode to advance the programming operation.

These programming/programming verification operations are repeated until the threshold voltage of the reference memory cell 17 enters into an allowable range.

FIG. 2 is a circuit diagram of a reference memory cell initialization circuit based on a conventional second method. In this drawing, the reference numeral 22 denotes a plurality of memory cells, each of which comprises a gate connected to a word line 23 and a drain connected to a bit line. An inverter is connected to the initial input of each of the word lines 23.

A selection transistor 25 is connected between a cascode device 26 and the drain of each of the memory cells 22 to connect a column load device 27 to a selected one of the memory cells 22. An inverter is connected between a gate and source of the cascode device 26 to invert a signal on the source and transfer the inverted signal to the gate.

Also, the reference numeral 29 denotes a plurality of reference memory cells, each of which comprises a source, drain, control gate and floating gate. Each of the reference memory cells 29 is connected to a reference column load device 32 via a corresponding selection device 30 and a cascode device 31. An inverter is connected between a gate and source of the cascode device 31 to invert a signal on the source and transfer the inverted signal to the gate.

A sense amplifier 28 is adapted to input a voltage signal at a contact node CN1 between the column load device 27 and the cascode device 26 at its SIN terminal and a voltage signal at a contact node CN2 between the column load device 32 and the cascode device 31 at its RIN terminal in a read mode. A switch SW is disposed between the contact node CN1 and the SIN terminal of the sense amplifier 28 to control the transfer of the voltage signal at the contact node CN1 to the SIN terminal. An NMOS transistor 36 is operated under control of a controller 34 to transfer the voltage signal at the contact node CN1 to a pad 35 when the switch SW is closed.

The sense amplifier 28 compares the voltage signal at the SIN terminal with that at the RIN terminal.

The floating gates of the reference memory cells 29 are programmed with different levels. A voltage switch 33 is provided to supply a charge pulse to the gate of each of the reference memory cells 29 until the reference memory cells 29 are programmed with different levels, namely, they store target charge amounts, respectively.

The controller 34 is adapted to control the voltage switch 33, selection device 30, NMOS transistor 36 and switch SW.

The operation of the second method-based reference memory cell initialization circuit with the above-mentioned construction will hereinafter be described.

The second method is to accurately set target threshold voltages of the reference memory cells according to characteristic curves of loads connected to reference memory cell bit lines and combine programming pulses into a plurality of groups upon programming the reference memory cells, so as to minimize time required in programming the reference memory cells up to the set target threshold voltages.

In other words, the second method first makes a programming pulse wide in width to move a threshold voltage of a specific reference memory cell to a target value at a large pace and then reduces the programming pulse width gradually as the threshold voltage of the reference memory cell approximates to the target value. Therefore, the second method is able to minimize the target threshold voltage arrival time while securing the accuracy at the maximum.

References for the above programming pulse combination and programming verification are set by the controller 34.

A specific reference memory cell is programmed and the programming verification operation is then performed to check whether a threshold voltage of the reference memory cell has arrived at a target value. If the threshold voltage of the reference memory cell has not arrived yet at the target value, the programming/programming verification operation are repeated until the threshold voltage of the reference memory cell arrives at the target value.

In other words, an accurate verification reference voltage is applied externally through the controller 34 to initialize one or more reference memory cells with difference threshold voltages, and a plurality of programming pulse combinations are used to reduce the entire programming time.

However, the above-mentioned conventional reference memory cell initialization circuits have the following disadvantages.

Firstly, the amount of implanted charge is verified whenever a programming pulse is supplied to a reference memory cell. As a result, a large amount of time is required in allowing a threshold voltage of the reference memory cell to arrive at a target value.

Secondly, a separate controller must be used to first make the programming pulse wide in width and then reduce the programming pulse width gradually as the threshold voltage of the reference memory cell approximates to the target value. The use of such a controller makes the entire construction complicated.

Thirdly, the resolution is within the range of the last pulse width.

SUMMARY OF THE INVENTION

Therefore, the present invention has been made in view of the above problems, and it is an object of the present invention to provide a circuit and method for initializing a reference memory cell, in which the reference memory cell is accurately initialized within a minimized period of time.

In accordance with one aspect of the present invention, there is provided a circuit for initializing a reference memory cell, comprising the reference memory cell having a source, drain, control gate and floating gate; a first voltage source for supplying a first voltage to the drain of the reference memory cell in a programming mode of the reference memory cell; a second voltage source for supplying a second voltage to the control gate of the reference memory cell in the programming mode or a read mode of the reference memory cell; a third voltage source for supplying a third voltage to the source of the reference memory cell; a fourth voltage source for supplying a fourth voltage to the source of the reference memory cell in an erase mode of the reference memory cell, the fourth voltage being an erase voltage; a first switch selectively connected to the drain of the reference memory cell in response to a measure signal, for controlling a path for measuring the amount of external current flowing to the reference memory cell; a second switch connected to the source of the reference memory cell for connecting it to the third voltage source or the fourth voltage source in response to an erase control signal; and a current detector connected between the first voltage source and the drain of the reference memory cell, for starting the programming mode of the reference memory cell in response to a programming control signal, monitoring the amount of current flowing to the reference memory cell and outputting a stop signal to the first and second voltage sources when the monitored current amount is equal to the amount of external stop current, to compulsorily stop the programming mode of the reference memory cell.

In accordance with another aspect of the present invention, there is provided a method for initializing a reference memory cell using a reference memory cell initialization circuit, comprising the steps of a) applying a first reference stop current value to a current detector; b) setting the resultant value as a first current increment by quadrisecting the first reference stop current value; c) programming the reference memory cell on the basis of the first reference stop current value; d) measuring a current value of the reference memory cell by closing a first switch connected to an external pad; e) determining whether the measured current value is larger than or equal to a first target current value; f) subtracting the first current increment from the first reference stop current value if it is determined at the step (e) that the measured current value is larger than or equal to the first target current value, setting the resultant value as a second reference stop current value and repeating the steps c) to e) until the measured current value becomes smaller than the first target current value; g) determining whether the measured current value is larger than or equal to a second target current value, if it is determined at the step (e) that the measured current value is smaller than the first target current value; h) ending an initialization operation of the reference memory cell if it is determined at the step (g) that the measured current value is larger than or equal to the second target current value; I) setting the resultant value as a third reference stop current value by adding the first current increment to the second reference stop current value if it is determined at the step (g) that the measured current value is smaller than the second target current value; j) setting the resultant value as a second current increment by bisecting the first current increment; k) setting the resultant value as a fourth reference stop current value by subtracting the second current increment from the third reference stop current value; l) erasing the reference memory cell; and m) repeating the steps c) to l) until the measured current value becomes larger than or equal to the second target current value.

Generally, a reference memory cell is used for a read operation or a programming operation in a flash memory. An external device is typically used to initialize the reference memory cell with a proper value at a test step.

In particular, in the case where a main memory cell is a multilevel cell for storing one or more bits, it is important to accurately initialize the reference memory cell with a desired value. The reason is that a reference level should accurately be inserted between levels of the main memory cell.

In the initialization of the reference memory cell, it is important to accurately produce desired reference current, and time required for the initialization is also very important because the initialization is typically performed at the test step. Therefore, the initialization of the reference memory cell must be performed as accurately as possible within an allowable period of time.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
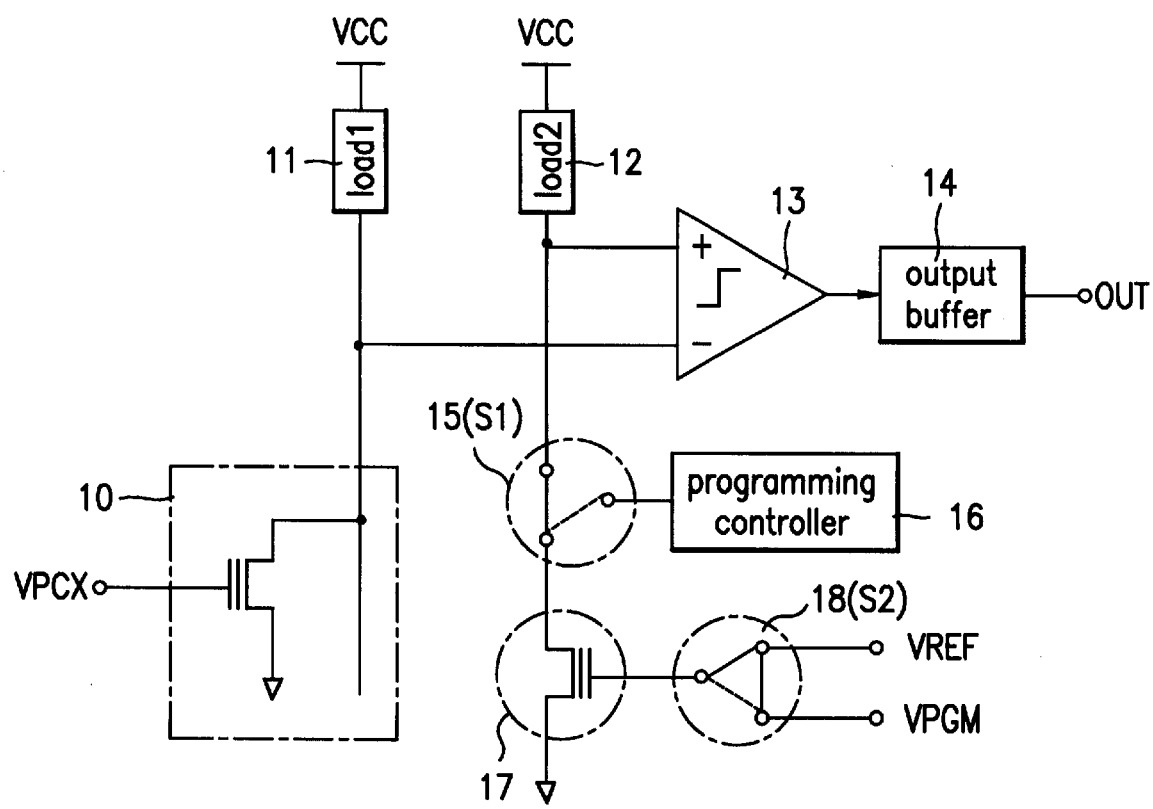
FIG. 1 is a circuit diagram of a reference memory cell initialization circuit based on a conventional first method.
Figure 2:
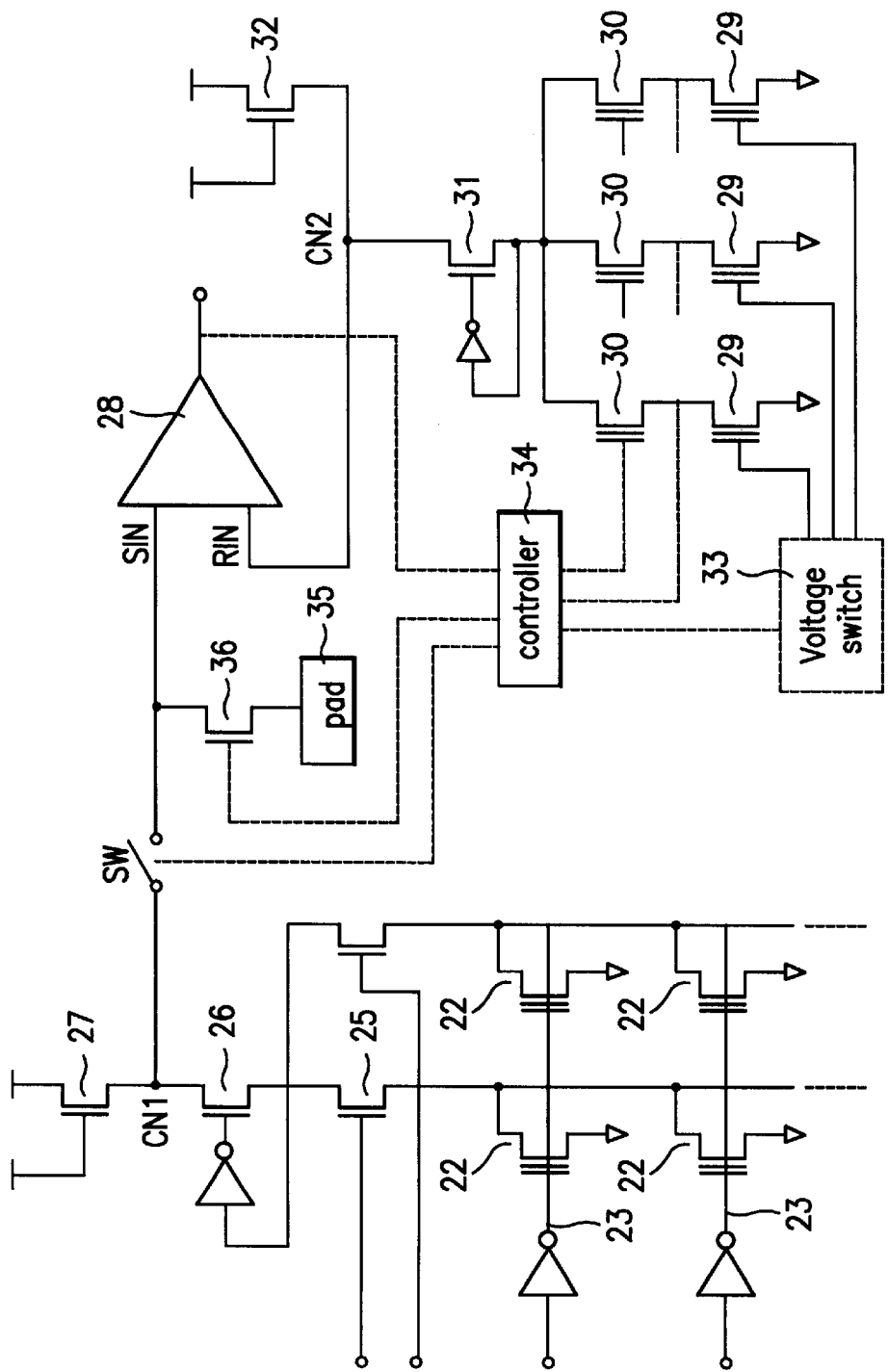
FIG. 2 is a circuit diagram of a reference memory cell initialization circuit based on a conventional second method.
Figure 3:
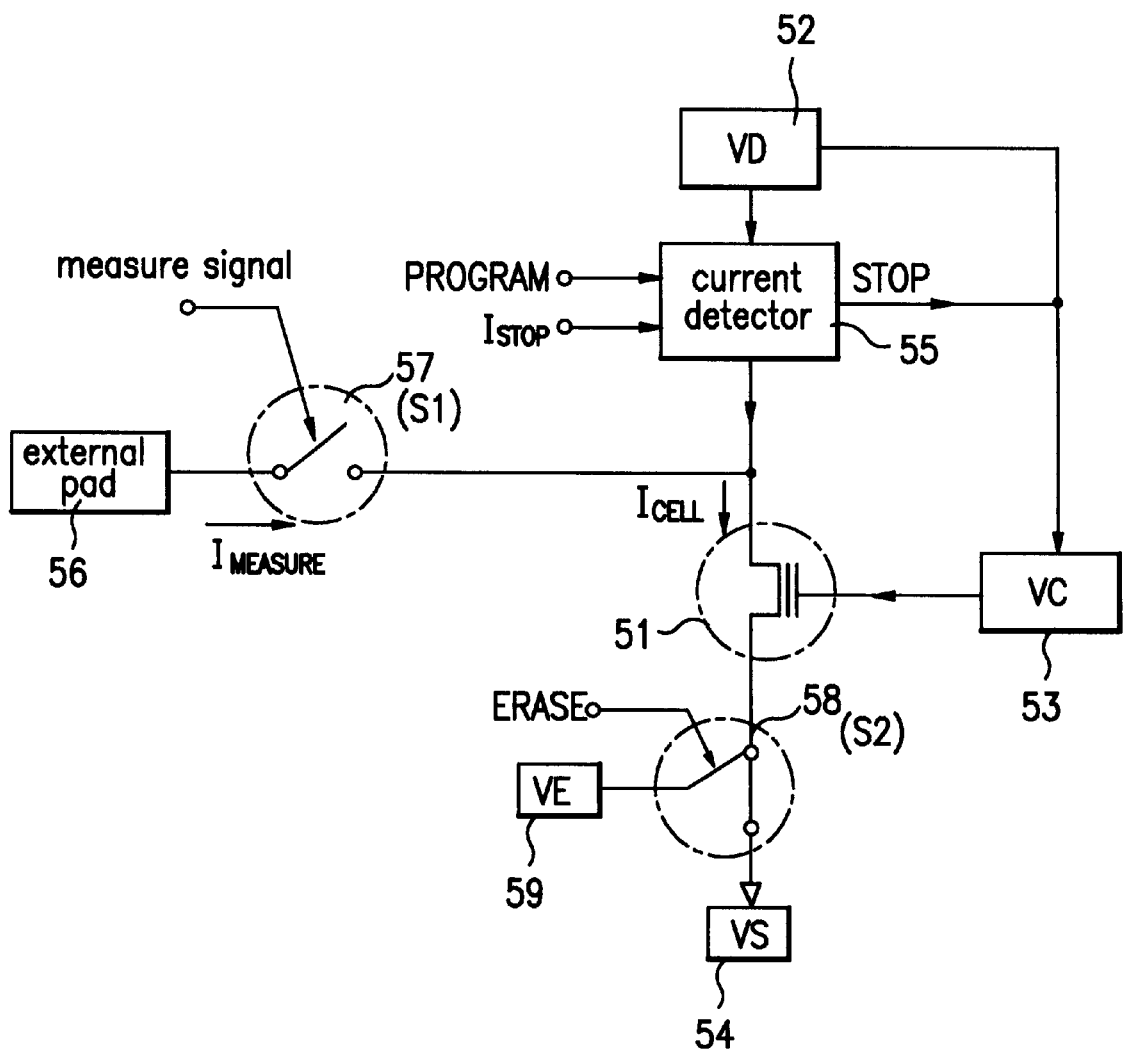
FIG. 3 is a circuit diagram of a reference memory cell initialization circuit in accordance with an embodiment of the present invention.

FIG. 3 is a circuit diagram of a reference memory cell initialization circuit in accordance with an embodiment of the present invention. In this drawing, the reference numeral 51 denotes a reference memory cell which has a source, drain, floating gate and control gate, and the reference numeral 52 denotes a first voltage source which supplies a programming voltage to the drain of the reference memory cell 51 in a programming mode of the reference memory cell 51.

A second voltage source 53 is provided to apply a voltage to the control gate of the reference memory cell 51 in the programming mode or a read mode of the reference memory cell 51, and a third voltage source 54 is provided to apply a voltage to the source of the reference memory cell 51. The voltage from the third voltage source 54 is lower in level than those from the first and second voltage sources 52 and 53.

A fourth voltage source 59 is provided to apply a voltage to the source of the reference memory cell 51 in an erase mode of the reference memory cell 51.

A first switch S1 57 is selectively connected to the drain of the reference memory cell 51 in response to a measure signal to control a path for measuring the amount of external current flowing to the reference memory cell 51.

A current detector 55 is connected between the first voltage source 52 and the drain of the reference memory cell 51. The current detector 55 starts the programming mode of the reference memory cell 51 in response to a programming control signal PROGRAM, detects the amount of current flowing to the reference memory cell 51 and generates a stop signal STOP when the detected current amount is equal to the amount of reference stop current $I_{STOP}$, to compulsorily stop the programming mode of the reference memory cell 51.

A second switch S2 58 is connected to the source of the reference memory cell 51 to connect it to the third voltage source 54 or the fourth voltage source 59 in response to an erase control signal ERASE.

Although not shown in FIG. 3, alternatively, a plurality of reference memory cells 51 may be provided and a selection transistor (Y-selector) may be connected between the current detector 55 and a drain of each of the reference memory cells 51 to connect the current detector 55 to a selected one of the reference memory cells 51.

Figure 4:
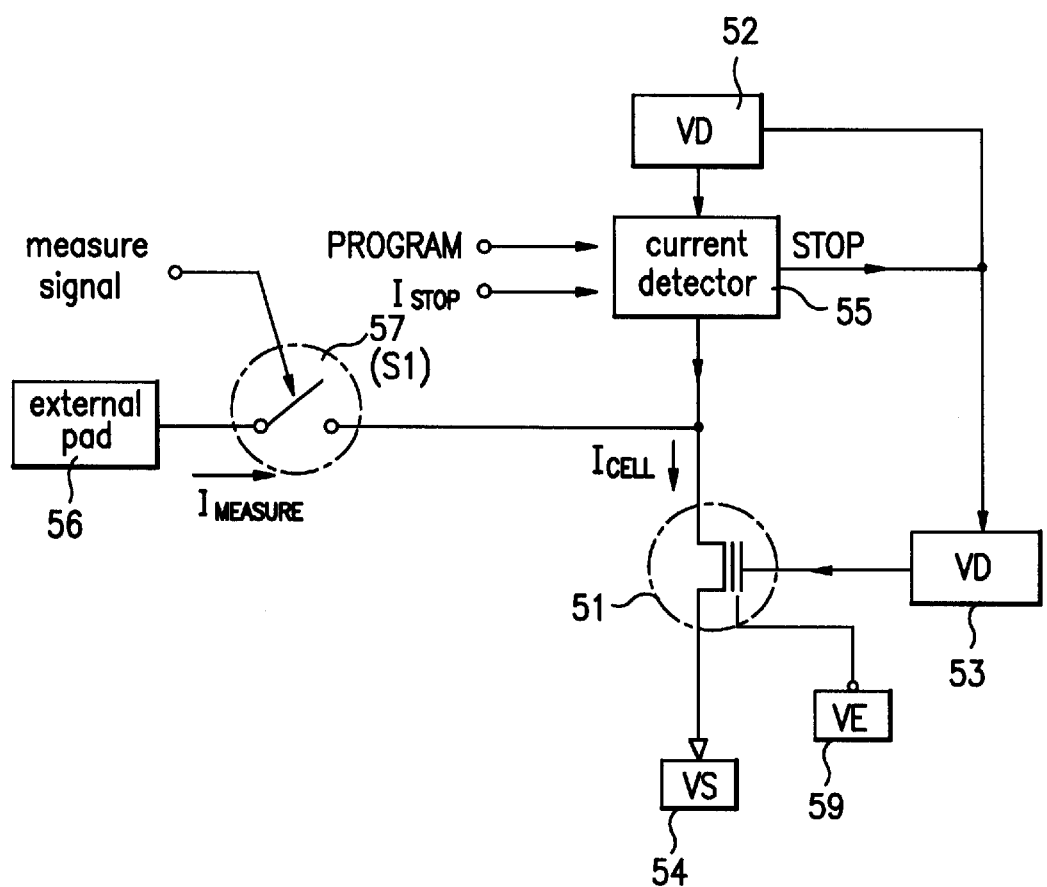
FIG. 4 is a circuit diagram of a reference memory cell initialization circuit in accordance with an alternative embodiment of the present invention.

FIG. 4 is a circuit diagram of a reference memory cell initialization circuit in accordance with an alternative embodiment of the present invention. The second embodiment is substantially the same in construction as the first embodiment, with the exception that the third voltage source 54 is connected directly to the source of the reference memory cell 51, not via the second switch 58, and the fourth voltage source 59 is connected directly to the floating gate of the reference memory cell 51, not via the second switch 58, to apply an erase voltage VE thereto in the erase mode of the reference memory cell 51.

Although not shown in FIG. 4, alternatively, a plurality of reference memory cells 51 may be provided and a selection transistor (Y-selector) may be connected between the current detector 55 and a drain of each of the reference memory cells 51 to connect the current detector 55 to a selected one of the reference memory cells 51.

In the first and second embodiments, the second voltage source 53 is used in both the programming and read modes of the reference memory cell 51 to provide different voltages or the same voltage VC. For a description to come later in this specification, it will be assumed that the second voltage source 53 provides the same voltage VC in the programming and read modes of the reference memory cell 51. Namely, the second voltage source 53 uses a voltage value for the read mode of the reference memory cell 51 directly for the programming mode of the reference memory cell 51.

An external pad 56 may be connected to the drain of the reference memory cell 51 through the first switch 57, which controls the connection between the drain of the reference memory cell 51 and the external pad 56 in response to the measure signal. This connection path is used to measure the amount of current flowing to the reference memory cell 51 under the condition that the reference memory cell 51 is actually operated.

In order to measure the amount of current flowing to the reference memory cell 51, the second voltage source 53 applies a voltage VC used for initialization of the reference memory cell 51 to the control gate of the reference memory cell 51, and the first voltage source 52 applies a voltage VD which is lower in level than that used for the initialization of the reference memory cell 51, to the drain of the reference memory cell 51. If the voltage for the initialization of the reference memory cell 51 is applied directly to the drain of the reference memory cell 51 as in the control gate thereof, a programming operation will be started just when the reference memory cell 51 is actually operated, resulting in no significance in a threshold voltage of the reference memory cell 51, set with much effort.

In this regard, when the reference memory cell 51 is actually operated after being initialized, a voltage of about 1V is applied to the drain of the reference memory cell 51 and the amount of current flowing from the external pad 56 to the reference memory cell 51 is measured while the same voltage is supplied from the external pad 56. A programming control signal PROGRAM of logic "0" is applied to the current detector 55 to disable it, so as to assure that the VD voltage has no effect on the external measurement of the amount of current flowing to the reference memory cell 51 and that only current $I_{MEASURE}$ to be measured flows from the external pad 56 to the reference memory cell 51.

In this manner, the current detector 55 functions to control the programming mode of the reference memory cell 51 in response to the programming control signal PROGRAM.

For example, in the case where the programming control signal PROGRAM is "0" in logic, the current detector 55 is disabled to block a current path from the first voltage source 52 to the drain of the reference memory cell 51. This disabled condition of the current detector 55 is applied to erase the reference memory cell 51 or measure a current value thereof.

In the case where the programming control signal PROGRAM is "1" in logic, the current detector 55 is enabled to transfer the VD voltage from the first voltage source 52 to the drain of the reference memory cell 51 so as to start the programming mode of the reference memory cell 51. At the same time as starting the programming mode of the reference memory cell 51, the current detector 55 monitors the amount of current flowing to the reference memory cell 51 to check whether it is equal to the amount of the predetermined stop current $I_{STOP}$. At the moment that the two current amounts become equal to each other, the current detector 55 outputs the stop signal STOP to disable the first and second voltage sources 52 and 53 which apply their voltages respectively to the drain and control gate of the reference memory cell 51. As the first and second voltage sources 52 and 53 are disabled, the programming mode of the reference memory cell 51 is forced to be stopped.

Conventionally, the amount of charge was implanted every time using a programming pulse while being quantized into a constant value (i.e., discrete in time), and the threshold voltage of the reference memory cell approximated to a target value while the charge implantation was repeated. However, in the present invention, because the charge implantation is consecutive in time, there is basically no problem such as the limitation in a threshold voltage resolution resulting from a pulse width (the amount of charge implanted once) as in conventional reference memory cell initialization circuits.

On the other hand, an erase operation is performed to lower the threshold voltage of the reference memory cell 51, whereas the programming operation is performed to raise it.

In the erase mode of the reference memory cell 51, first, the first switch S1 57 is opened to block the connection path between the reference memory cell 51 and the external pad 56, and the programming control signal PROGRAM of logic "0" is applied to the current detector 55 to disable it. Then, the second voltage source 53 supplies the same VC voltage as the VS voltage from the third voltage source 54 to the control gate of the reference memory cell 51, and the erase control signal ERASE is applied to the second switch S2 58 to connect the source of the reference memory cell 51 to the fourth voltage source 59. As a result, the fourth voltage source 59 applies an erase voltage pulse VE to the reference memory cell 51 to erase it.

The programming method of the present invention is that the threshold voltage of the reference memory cell approximates to a target value while the amount of error is reduced by half whenever the reference memory cell is programmed, which is based on auto-verification and bisection in numerical analysis.

Now, the method for initializing the reference memory cell in accordance with the present invention as mentioned above will be described in detail with reference to FIGS. 5 and 6.

Figure 5:
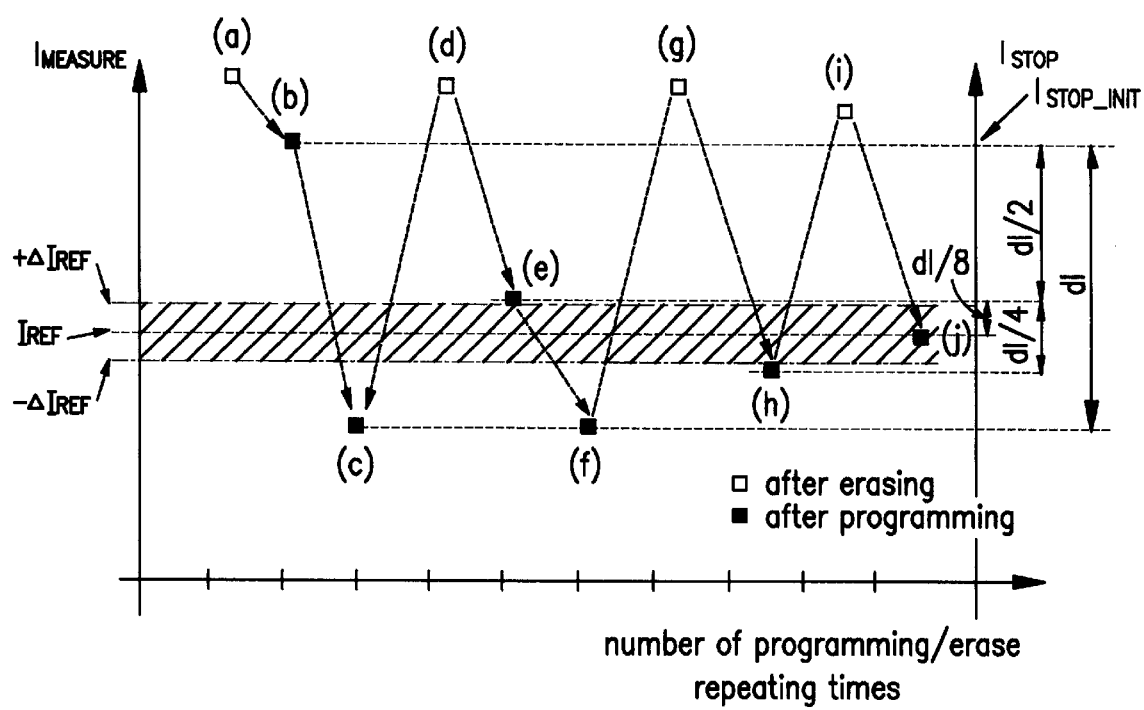
FIG. 5 is a view illustrating a reference memory cell initialization concept of the present invention.

FIG. 5 is a view illustrating a reference memory cell initialization concept of the present invention. In this drawing, $I_{REF}$ is an accurate target value and $\pm \Delta I_{REF}$ is a margin capable of accepting a given value as the target value $I_{REF}$. The accuracy of arrival at the target value is estimated according to a relative range of the margin set on the basis of the target value.

The X axis represents the number of programming/erase repeating times, the left Y axis represents the amount of current flowing to the reference memory cell 51, measured under the condition that the reference memory cell 51 is actually operated, and the right Y axis represents the reference stop current $I_{STOP}$ which is applied to the current detector 55 in the programming mode of the reference memory cell 51 to stop the programming mode.

In FIG. 3, the programming mode of the reference memory cell 51 is forced to be stopped at the moment that the amount of current $I_{CELL}$ flowing to the reference memory cell 51 becomes equal to that of the reference stop current $I_{STOP}$ applied to the current detector 55 in the programming mode. In this regard, if the programming mode of the reference memory cell 51 is performed under the condition that the amount of the reference stop current $I_{STOP}$ is set to be equal to that of the target current $I_{REF}$, then the amount of current $I_{CELL}$ flowing to the reference memory cell 51 will become equal to the target current $I_{REF}$. As a result, the threshold voltage of the reference memory cell 51 seems to be accurately set to the target value by one programming operation.

Such a hypothesis may be a fact if the conditions (the voltages applied to the control gate and drain) in the actual operation of the reference memory cell 51 are the same as those in the programming mode for initialization. However, as stated previously, the same voltage may be applied to the control gate of the reference memory cell 51 in the programming mode and read mode, but the voltage applied to the drain of the reference memory cell 51 in the read mode should be relatively much lower than that in the programming mode. If the conditions are the same in the programming and read modes, the initialization will become insignificant because the programming mode is performed just when the voltages are applied to the reference memory cell 51 to read a current value therefrom.

As stated above, a point of difference between the programming (initialization) mode and the read (actual operation) mode is that different voltages are applied to the drain of the reference memory cell 51 (i.e., a high voltage of 4~6V in the programming mode and a low voltage of 1V in the read mode).

On the other hand, if a drain conductance $G_{ds}$ of the reference memory cell 51 is ideally "0" (an output impedance of the reference memory cell 51 is ∞) and there is thus no current variation in the reference memory cell 51 resulting from a drain voltage in a saturation region, it will also be possible that the current of the reference memory cell 51 arrives at the target value by one programming operation.

However, there is actually no ideal reference memory cell with $G_{ds}=0$. As a result, different amounts of current flow to the reference memory cell 51 in the programming and read modes because different voltages are applied to the drain of the reference memory cell 51 in the programming and read modes although the same voltage is applied to the control gate of the reference memory cell 51 in the programming and read modes.

Further, because the drain conductance $G_{ds}$ of the reference memory cell 51 is positive, the amount of current in the programming mode is larger than that in the read mode. Hence, if the reference memory cell 51 is programmed with the reference stop current $I_{STOP}$ being added with the target current $I_{REF}$ in the programming mode and current is then read therefrom in the read mode, the read current will always be smaller in amount than the target current $I_{REF}$.

In the case where the reference stop current $I_{STOP}$ is large in amount, the programming mode is stopped when the current of the reference memory cell 51 is large in amount, resulting in a reduction in time being required in the programming mode. Thus, a smaller amount of charge is implanted into the floating gate of the reference memory cell 51, so that the threshold voltage of the reference memory cell 51 can be programmed with a lower value. To the contrary, in the case where the reference stop current $I_{STOP}$ is small in amount, the programming mode is stopped when the current of the reference memory cell 51 is small in amount, resulting in an increase in time being required in the programming mode. Consequently, a larger amount of charge is implanted into the floating gate of the reference memory cell 51, thereby causing the threshold voltage of the reference memory cell 51 to be programmed with a higher value.

If the threshold voltage of the reference memory cell 51 is low in level, current thereof read in the same condition is large in amount. To the contrary, in the case where the threshold voltage of the reference memory cell 51 is high in level, current thereof read in the same condition is small in amount.

In the upper part of FIG. 5 where a larger amount of current flows to the reference memory cell 51, the threshold voltage is lower in level and '□' represents a current value of the reference memory cell 51 after the erase mode is performed. In the lower part of FIG. 5 where a smaller amount of current flows to the reference memory cell 51, the threshold voltage is higher in level and '■' represents a current value of the reference memory cell 51 after the programming mode is performed.

Figure 6:
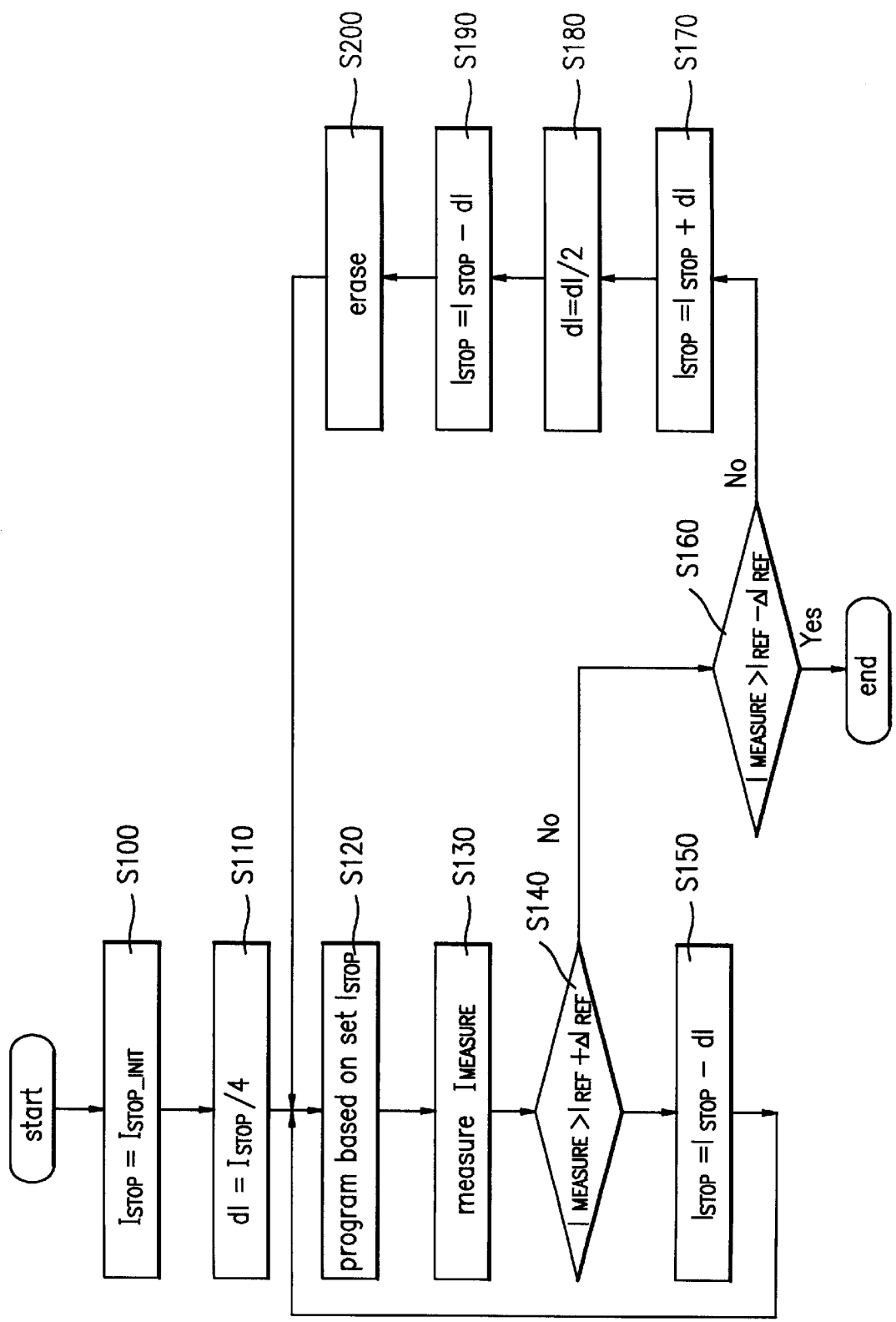
FIG. 6 is a flowchart illustrating a reference memory cell initialization method in accordance with the present invention.

FIG. 6 is a flowchart illustrating the reference memory cell initialization method in accordance with the present invention. First, after the reference memory cell 51 is erased as indicated by (b) in FIG. 5, a first reference stop current value $I_{STOP\_INIT}$ is set as the reference stop current value $I_{STOP}$ to the current detector 55 at step S100 and the reference memory cell 51 is primarily programmed on the basis of the set reference stop current value $I_{STOP}$.

At this time, the first reference stop current value $I_{STOP\_INIT}$ is set to be sufficiently larger than the target current value $I_{REF}$ and an initial one of current increments dl to be used for respective repetitive operations is set to ¼ of the set reference stop current value $I_{STOP}$ at step S110.

If a current value is read from the reference memory cell 51 after being primarily programmed, it is measured to be larger than the target current value $I_{REF}$ as indicated by (b) in FIG. 5. For this reason, the initial current increment dl is subtracted from the current reference stop current value $I_{STOP}$, the resultant value is set as a new reference stop current value $I_{STOP}$ and the reference memory cell 51 is secondarily programmed on the basis of the new reference stop current value $I_{STOP}$ at step S120.

A current value of the reference memory cell 51 is measured at step S130 after being secondarily programmed and it is determined at step S140 whether the measured current value $I_{MEASURE}$ is larger than or equal to a first target current value $I_{REF}+\Delta I_{REF}$.

If the measured current value $I_{MEASURE}$ is larger than or equal to the first target current value $I_{REF}+\Delta I_{REF}$, the initial current increment dl is subtracted from the reference stop current value $I_{STOP}$ set at the above step S120 and the resultant value is set as a new reference stop current value $I_{STOP}$ at step S150. Then, the reference memory cell 51 is programmed on the basis of the set reference stop current value $I_{STOP}$, a current value is read from the reference memory cell 51, the initial current increment dl is subtracted from the current reference stop current value $I_{STOP}$ if the read current value is larger than or equal to the first target current value $I_{REF}+\Delta I_{REF}$ and this procedure is repeated until the read current value becomes smaller than the first target current value $I_{REF}+\Delta I_{REF}$ as indicated by (c) in FIG. 5.

Thereafter, if the measured current value $I_{MEASURE}$ is smaller than the first target current value $I_{REF}+\Delta I_{REF}$ it is determined at step S160 whether the measured current value $I_{MEASURE}$ is larger than or equal to a second target current value $I_{REF}-\Delta I_{REF}$. If the measured current value $I_{MEASURE}$ is larger than or equal to the second target current value $I_{REF}-\Delta I_{REF}$, then the programming mode is ended.

To the contrary, in the case where the measured current value $I_{MEASURE}$ is smaller than the second target current value $I_{REF}-\Delta I_{REF}$, the initial current increment dl is added to the reference stop current value $I_{STOP}$ at the last programming point of time as indicated by (c) in FIG. 5 and the resultant value is set as a new reference stop current value $I_{STOP}$ at step S170. Then, the initial current increment dl is reduced to ½ and the resultant value is set as a new current increment dl at step S180. The new current increment dl is subtracted from the reference stop current value $I_{STOP}$ set at the above step S170 and the resultant value is set as a new reference stop current value $I_{STOP}$ at step S190.

Then, the reference memory cell 51 is again erased as indicated by (d) in FIG. 5 at step S200. In this manner, the current increment dl is reduced by ½ in each erase operation.

Thereafter, the reference memory cell 51 is again programmed on the basis of the reference stop current value $I_{STOP}$ set at step S190 as indicated by (e) in FIG. 5 at step S120 and a current value is read from the reference memory cell 51. If the read current value is larger than or equal to a target current value, the reference stop current value $I_{STOP}$ is decremented by the current increment dl and the reference memory cell 51 is again programmed on the basis of the resultant reference stop current value $I_{STOP}$ as indicated by (f) in FIG. 5. To the contrary, in the case where the read current value is smaller than the target current value, the reference memory cell 51 is again erased as indicated by (g) in FIG. 5. The current increment dl is added to the reference stop current value $I_{STOP}$ at step S170 so that the reference stop current value $I_{STOP}$ can be at the state (e) before the last programming. The bisected current increment dl is rebisected at step S180. The rebisected current increment dl is subtracted from the reference stop current value $I_{STOP}$ and the reference memory cell 51 is again programmed on the basis of the resultant reference stop current value $I_{STOP}$ as indicated by (h) in FIG. 5. The reference memory cell 51 is again erased as indicated by (i) in FIG. 5 and the rebisected current increment dl is further rebisected at step S180. With this procedure repeated, the current value of the reference memory cell 51 is ultimately converged on the target current value as indicated by (j) in FIG. 5.

In this manner, the above operation is repeated until the measured current value enters into the range of the target current value $I_{REF}\pm\Delta I_{REF}$.

The reference memory cell initialization method as mentioned above will hereinafter be described with reference to a numerical example.

Assuming that a target current value is 20+1 µA and an initial value of current increment dl is 5 µA, the current increment dl becomes 5 µA→2.5 µA→1.25 µA→0.625 µA whenever the erase mode is performed. As seen from this fact, the current value of the reference memory cell can arrive at the target current value through only three repetitions. With the initial current increment dl being larger, the erase mode is repeated a greater number of times. For this reason, it is preferred that the initial current increment dl is set to a smaller value. But, because, with the initial current increment dl being too small, the programming mode is repeated a greater number of times from the initial programming mode to the initial erase mode, it is not preferred that the initial current increment dl is set to a too small value.

Once the erase mode is performed, the programming mode can be repeated twice at the maximum until the subsequent erase mode is performed. The reason is that the reference memory cell returns to a state prior to the erasing if it is programmed twice. As a result, the maximum number of programming repeating times is 5 in the above example. The maximum number of programming repeating times is not 6 but 5, since, in the last repetition, the current value of the reference memory cell enters into the target current value range just when it is programmed once.

As apparent from the above description, according to the present invention, the current value of the reference memory cell is accurately set to within the target current value range under the actual operation environment within a minimized period of time.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A circuit for initializing a reference memory cell, comprising:

said reference memory cell having a source, drain, control gate and floating gate;

a first voltage source for supplying a first voltage to said drain of said reference memory cell in a programming mode of said reference memory cell;

a second voltage source for supplying a second voltage to said control gate of said reference memory cell in said programming mode or a read mode of said reference memory cell;

a third voltage source for supplying a third voltage to said source of said reference memory cell;

a fourth voltage source for supplying a fourth voltage to said source of said reference memory cell in an erase mode of said reference memory cell, said fourth voltage being an erase voltage;

a first switch selectively connected to said drain of said reference memory cell in response to a measure signal, for controlling a path for measuring the amount of external current flowing to said reference memory cell;

a second switch connected to said source of said reference memory cell for connecting it to said third voltage source or said fourth voltage source in response to an erase control signal; and a current detector connected between said first voltage source and said drain of said reference memory cell, for starting said programming mode of said reference memory cell in response to a programming control signal, monitoring the amount of current flowing to said reference memory cell and outputting a stop signal to said first and second voltage sources when the monitored current amount is equal to the amount of external stop current, to compulsorily stop said programming mode of said reference memory cell.

2. The circuit as set forth in claim 1, further comprising:

a plurality of reference memory cells; and a selection transistor connected between said current detector and a drain of each of said reference memory cells for connecting said current detector to a selected one of said reference memory cells.

3. A circuit for initializing a reference memory cell, comprising:

said reference memory cell having a source, drain, control gate and floating gate;

a first voltage source for supplying a first voltage to said drain of said reference memory cell in a programming mode of said reference memory cell;

a second voltage source for supplying a second voltage to said control gate of said reference memory cell in said programming mode or a read mode of said reference memory cell;

a third voltage source for supplying a third voltage to said source of said reference memory cell;

a fourth voltage source for supplying a fourth voltage directly to said floating gate of said reference memory cell in an erase mode of said reference memory cell, said fourth voltage being an erase voltage;

a switch selectively connected to said drain of said reference memory cell in response to a measure signal, for controlling a path for measuring the amount of external current flowing to said reference memory cell; and a current detector connected between said first voltage source and said drain of said reference memory cell, for starting said programming mode of said reference memory cell in response to a programming control signal, monitoring the amount of current flowing to said reference memory cell and outputting a stop signal to said first and second voltage sources when the monitored current amount is substantially equal to the amount of external stop current, to stop said programming mode of said reference memory cell.

4. The circuit as set forth in claim 3, further comprising:

a plurality of reference memory cells; and a selection transistor connected between said current detector and a drain of each of said reference memory cells for connecting said current detector to a selected one of said reference memory cells.

5. A method for initializing a reference memory cell using a reference memory cell initialization circuit, comprising:

a) applying a first reference stop current value to a current detector;

b) setting the resultant value as a first current increment by dividing said first reference stop current value;

c) programming said reference memory cell on the basis of said first reference stop current value;

d) measuring a current value of said reference memory cell by closing a first switch connected to an external pad;

e) determining whether the measured current value is larger than or equal to a first target current value;

f) subtracting said first current increment from said first reference stop current value if it is determined at said step (e) that the measured current value is larger than or equal to said first target current value, setting the resultant value as a second reference stop current value and repeating said steps c) to e) until the measured current value becomes smaller than said first target current value;

g) determining whether the measured current value is larger than or equal to a second target current value, if it is determined at said step (e) that the measured current value is smaller than said first target current value;

h) ending an initialization operation of said reference memory cell if it is determined at said step (g) that the measured current value is larger than or equal to said second target current value;

i) setting the resultant value as a third reference stop current value by adding said first current increment to said second reference stop current value if it is determined at said step (g) that the measured current value is smaller than said second target current value;

j) setting the resultant value as a second current increment by dividing said first current increment;

k) setting the resultant value as a fourth reference stop current value by subtracting said second current increment from said third reference stop current value;

l) resetting said reference memory cell; and m) repeating said steps c) to l) until the measured current value becomes larger than or equal to said second target current value.

6. The method as set forth in claim 5, wherein said step c) includes opening said first switch connected to said external pad, connecting a second switch between a source of said reference memory cell and a voltage source and applying a programming control signal of logic "1" to said current detector to program said reference memory cell.

7. The method as set forth in claim 5, wherein said step d) includes applying a programming control signal of logic "0" to said current detector and applying a predetermined voltage to a drain of said reference memory cell to measure the current value of said reference memory cell, said predetermined voltage being lower in level than a voltage when said reference memory cell is programmed.

8. The method as set forth in claim 5, wherein said step l) includes opening said first switch to block a connection path from said external pad, applying a ground voltage to a gate of said reference memory cell, applying an erase control signal to a second switch to connect it between a source of said reference memory cell and a voltage source and applying an erase voltage pulse to said reference memory cell to erase it.

9. The method as set forth in claim 5, wherein said step m) includes repeating said step c) using, as said first reference stop current value, said fourth reference stop current value set at the previously performed step k) to program said reference memory cell, wherein said dividing said first reference stop current value performs quadrisecting, and wherein said dividing of said first current increment performs bisecting.

10. A method for initializing a plurality of reference memory cells using a reference memory cell initialization circuit, comprising:

a) selecting any one of said reference memory cells;

b) applying a first reference stop current value to a current detector;

c) setting the resultant value as a first current increment by quadrisecting said first reference stop current value;

d) programming the selected reference memory cell on the basis of said first reference stop current value;

e) closing a first switch connected to an external pad and measuring a current value of said selected reference memory cell;

f) determining whether the measured current value is larger than or equal to a first target current value;

g) subtracting said first current increment from said first reference stop current value if it is determined at said step (f) that the measured current value is larger than or equal to said first target current value, setting the resultant value as a second reference stop current value and repeating said steps d) to f) until the measured current value becomes smaller than said first target current value;

h) determining whether the measured current value is larger than or equal to a second target current value, if it is determined at said step (f) that the measured current value is smaller than said first target current value;

i) ending an initialization operation of said selected reference memory cell if it is determined at said step (h) that the measured current value is larger than or equal to said second target current value;

j) adding said first current increment to said second reference stop current value if it is determined at said step (h) that the measured current value is smaller than said second target current value and setting the resultant value as a third reference stop current value;

k) setting the resultant value as a second current increment by bisecting said first current increment;

l) setting the resultant value as a fourth reference stop current value by subtracting said second current increment from said third reference stop current value;

m) erasing said selected reference memory cell; and n) repeating said steps d) to m) until the measured current value becomes larger than or equal to said second target current value.

11. The method as set forth in claim 10, wherein said step d) includes opening said first switch connected to said external pad, connecting a second switch between a source of said selected reference memory cell and a voltage source and applying a programming control signal of logic "1" to said current detector to program said selected reference memory cell.

12. The method as set forth in claim 10, wherein said step e) includes applying a programming control signal of logic "0" to said current detector and applying a predetermined voltage to a drain of said selected reference memory cell to measure the current value of said selected reference memory cell, said predetermined voltage being lower in level than a voltage when said selected reference memory cell is programmed.

13. The method as set forth in claim 10, wherein said step m) includes opening said first switch to block a connection path from said external pad, applying a ground voltage to a gate of said selected reference memory cell, applying an erase control signal to a second switch to connect it between a source of said selected reference memory cell and a voltage source and applying an erase voltage pulse to said selected reference memory cell to erase it.

14. The method as set forth in claim 10, wherein said step n) includes repeating said step d) using, as said first reference stop current value, said fourth reference stop current value set at the previously performed step l) to program said selected reference memory cell.

15. A method for initializing a reference memory cell using a reference memory cell initialization circuit, comprising:
 a) applying a first reference stop current value to a current detector;
 b) setting the resultant value as a first current increment using a first prescribed fraction of said first reference stop current value;
 c) opening a first switch connected to an external pad and applying a programming control signal of logic "1" to said current detector to program said reference memory cell on the basis of said first reference stop current value;
 d) applying a programming control signal of logic "0" to said current detector and closing said first switch to measure a current value of said reference memory cell;
 e) determining whether the measured current value is larger than or equal to a first target current value;
 f) subtracting said first current increment from said first reference stop current value if it is determined at said step (e) that the measured current value is larger than or equal to said first target current value, setting the resultant value as a second reference stop current value and repeating said steps c) to e) until the measured current value becomes smaller than said first target current value;
 g) determining whether the measured current value is larger than or equal to a second target current value, if it is determined at said step (e) that the measured current value is smaller than said first target current value;
 h) ending an initialization operation of said reference memory cell if it is determined at said step (g) that the measured current value is larger than or equal to said second target current value;
 i) adding said first current increment to said second reference stop current value if it is determined at said step (g) that the measured current value is smaller than said second target current value and setting the resultant value as a third reference stop current value;
 j) setting the resultant value as a second current increment using a second prescribed fraction of said first current increment;
 k) setting the resultant value as a fourth reference stop current value by subtracting said second current increment from said third reference stop current value;
 l) erasing said reference memory cell; and
 m) repeating said steps c) to l) until the measured current value becomes larger than or equal to said second target current value.

16. The method as set forth in claim 15, wherein said step d) includes applying a predetermined voltage to a drain of said reference memory cell to measure the current value of said reference memory cell, said predetermined voltage being lower in level than a voltage when said reference memory cell is programmed, and wherein the second prescribed fraction is larger than the first prescribed fraction.

17. The method as set forth in claim 15, wherein said step l) includes opening said first switch to block a connection path from said external pad, applying a ground voltage to a gate of said reference memory cell, applying an erase control signal to a second switch to connect it between a source of said reference memory cell and a voltage source and applying an erase voltage pulse to said reference memory cell to erase it.

18. The method as set forth in claim 15, wherein said step m) includes repeating said step c) using, as said first reference stop current value, said fourth reference stop current value set at the previously performed step k) to program said reference memory cell.

19. A method for initializing a plurality of reference memory cells using a reference memory cell initialization circuit, comprising:
 a) selecting any one of said reference memory cells;
 b) applying a first reference stop current value to a current detector;
 c) setting the resultant value as a first current increment by dividing said first reference stop current value;
 d) opening a first switch connected to an external pad and applying a programming control signal of logic "1" to said current detector to program said selected reference memory cell on the basis of said first reference stop current value;
 e) applying a programming control signal of logic "0" to said current detector and closing said first switch to measure a current value of said selected reference memory cell;
 f) determining whether the measured current value is larger than or equal to a first target current value;
 g) subtracting said first current increment from said first reference stop current value if it is determined at said step (f) that the measured current value is larger than or equal to said first target current value, setting the resultant value as a second reference stop current value and repeating said steps d) to f) until the measured current value becomes smaller than said first target current value;
 h) determining whether the measured current value is larger than or equal to a second target current value, if it is determined at said step (f) that the measured current value is smaller than said first target current value;
 i) ending an initialization operation of said selected reference memory cell if it is determined at said step (h) that the measured current value is larger than or equal to said second target current value;
 j) adding said first current increment to said second reference stop current value if it is determined at said step (h) that the measured current value is smaller than said second target current value and setting the resultant value as a third reference stop current value;
 k) setting the resultant value as a second current increment by dividing said first current increment;
 l) setting the resultant value as a fourth reference stop current value by subtracting said second current increment from said third reference stop current value;
 m) erasing said selected reference memory cell; and
 n) repeating said steps d) to m) until the measured current value becomes larger than or equal to said second target current value.

20. The method as set forth in claim 19, wherein said step e) includes applying a predetermined voltage to a drain of said selected reference memory cell to measure the current value of said selected reference memory cell, said predetermined voltage being lower in level than a voltage when said selected reference memory cell is programmed, wherein said dividing said first reference stop current value performs quadrisecting, and wherein said dividing of said first current increment performs bisecting.

21. The method as set forth in claim 19, wherein said step m) includes opening said first switch to block a connection path from said external pad, applying a ground voltage to a gate of said selected reference memory cell, applying an erase control signal to a second switch to connect it between a source of said selected reference memory cell and a voltage source and applying an erase voltage pulse to said selected reference memory cell to erase it.

22. The method as set forth in claim 19, wherein said step n) includes repeating said step d) using, as said first reference stop current value, said fourth reference stop current value set at the previously performed step l) to program said selected reference memory cell.

* * * * *